United States Patent [19]
Sakakibara et al.

[11] Patent Number: 6,007,928
[45] Date of Patent: Dec. 28, 1999

[54] ELECTROLUMINESCENCE LIGHT-EMITTING CELL

[75] Inventors: Mitsuhiko Sakakibara, Tsuchiura; Yasumasa Takeuchi, Yokohama; Ding-Kuo Ding, Tokyo, all of Japan

[73] Assignees: JSR Corporation, Tokyo; International Center for Materials Research, Kawasaki, both of Japan; TECO Electric & Machinery Co., Ltd., Taipei, Taiwan

[21] Appl. No.: 09/131,691

[22] Filed: Aug. 10, 1998

[30] Foreign Application Priority Data

Aug. 11, 1997 [JP] Japan .................................... 9-216486

[51] Int. Cl.$^6$ .................................................. H05B 33/00
[52] U.S. Cl. .......................... 428/690; 428/691; 428/917; 313/504
[58] Field of Search ............................. 525/280; 428/690, 428/691, 917; 313/504

[56] References Cited

FOREIGN PATENT DOCUMENTS

| 8208745 | 8/1996 | Japan | C08F 12/26 |
| 9255725 | 9/1997 | Japan | C08F 12/32 |

*Primary Examiner*—Charles Nold
*Attorney, Agent, or Firm*—Oblon, Spivak, McClelland, Maier & Neustadt, P.C.

[57] ABSTRACT

An EL cell exhibiting high luminous efficiency and excellent durability is disclosed. The EL cell comprises a layer of a block copolymer comprising a block component (A) of the following formula (1) having a positive hole transfer capability and a block component (B) of the following formula (2) having an electron transfer capability at molar ratio of the block component (A) to the block (B) between 0.1:99.9 and 99.9:0.1.

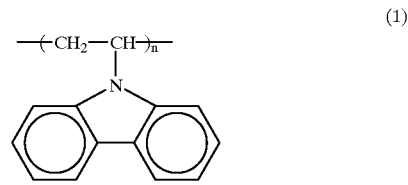

(1)

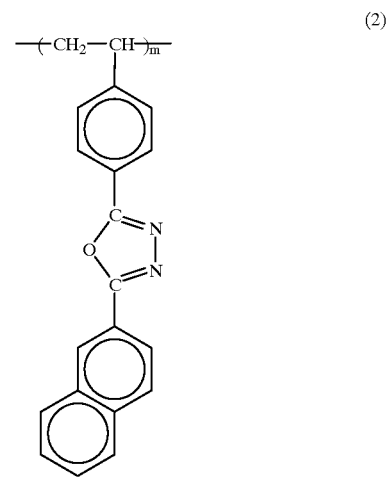

(2)

10 Claims, 1 Drawing Sheet

ELECTROLUMINESCENCE LIGHT-EMITTING CELL

BACKGROUND OF THE INVENTION

1. Field of the Invention

The present invention relates to an electroluminescence cell exhibiting high luminous efficiency and excellent durability.

2. Description of the Background Art

Use of organic materials as the positive hole transfer material and electron transfer material that constitute an electroluminescence cell has begun in recent years. Organic electroluminescence cells using such organic materials, hereinafter referred to as an "organic EL cell", are being vigorously researched. Organic materials that constitute such an organic EL cell are required to possess superior durability and high luminous efficiency.

Conventionally, as the organic material possessing a positive hole transfer capability, diamine derivatives which are low molecule organic materials such as aryl amine compounds such as N,N'-diphenyl-N,N'-di(3-methylphenyl)-4,4'-diaminobiphenyl (hereinafter also referred to as "TPD"), and macromolecule organic materials such as polyvinyl carbazole are known.

However, the above-mentioned low molecular weight organic materials lack physical or thermal durability. A positive hole transfer layer based on such low molecular weight materials tends to deteriorate while the organic EL cell is in use or in storage.

On the other hand, macromolecule organic materials such as polyvinyl carbazole have a very high glass transition temperature (Tg) which provides a positive hole transfer layer with excellent durability. However, they present problems in actual application, requiring a very high driving voltage and yet yielding a low luminous efficiency due to a deficiency in positive hole transfer capability.

Meanwhile, although 2-(4-biphenylyl)-5-(4-tert-butylphenyl)-1,3,4-oxadiazole (hereinafter also referred to as "PBD") is known as an electron transfer material, thin films made of PBD lack stability.

In consideration of the above circumstances, an object of the present invention is to provide a block copolymer, which enables production of an organic EL cell having a high luminous efficiency and excellent durability.

SUMMARY OF THE INVENTION

Accordingly, an object of the present invention is to provide an electroluminescence cell comprising a layer of a block copolymer comprising a block component (A) of the following formula (1),

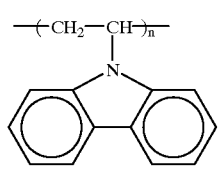

(1)

wherein n is an integer from 10 to 1,000, and a block component (B) of the following formula (2),

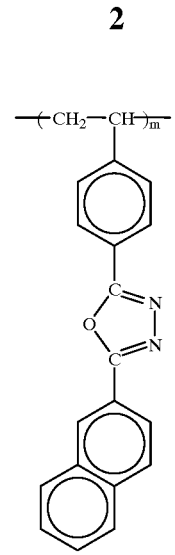

(2)

wherein m is an integer from 10 to 1,000, wherein the molar ratio of the block component (A) to the block (B) is between 0.1:99.9 and 99.9:0.1.

In a preferred embodiment the above electroluminescence cell of the present invention, the molar ratio of the block component (A) to the block component (B) is between 0.1:99.9 and 99.9:0.1.

In another preferred embodiment of the above electroluminescence cell, the layer of the block copolymer comprising the block component (A) and the block component (B) is a light-emitting layer.

Another object of the present invention is to provide an electroluminescence cell comprising a hole injection electrode layer, an electron injection light-emitting hole layer, and a light-emitting layer which is comprised of a block copolymer comprising a block component (A) of the following formula (1),

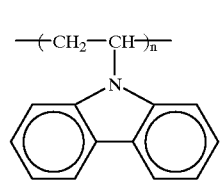

(1)

wherein n is an integer from 10 to 1,000, and a block component (B) of the following formula (2),

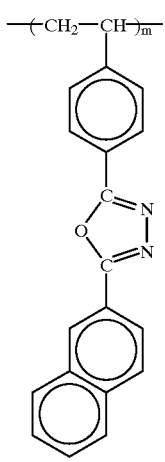

(2)

wherein m is an integer from 10 to 1,000, wherein the molar ratio of the block component (A) to the block component (B) is between 0.1:99.9 and 99.9:0.1.

Other objects, features and advantages of the invention will hereinafter become more readily apparent from the following description.

DETAILED DESCRIPTION OF THE INVENTION AND PREFERRED EMBODIMENTS

Block Copolymer

Figure 1:
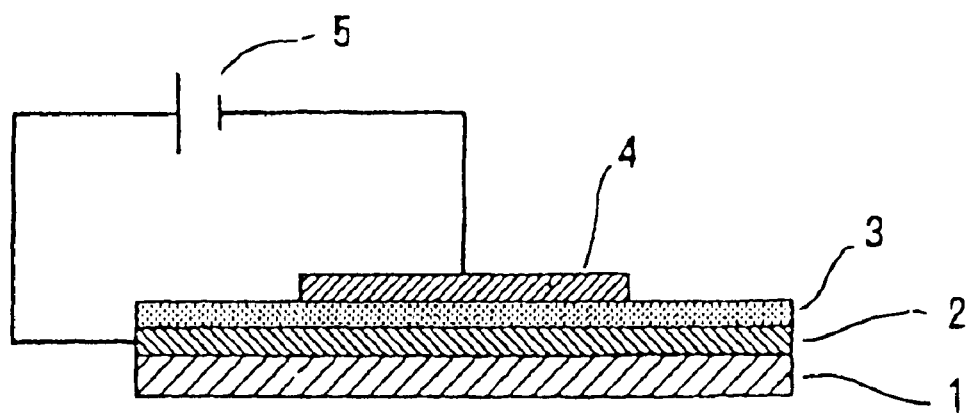
FIG. 1 is an illustrative sectional view describing an example of an organic electroluminescence cell utilizing the block copolymer of the present invention.

The block copolymer of the present invention comprises the block component (A) comprising poly-N-vinylcarbazole and the block component (B) comprising poly-2-β-naphthyl-5-(4-vinylphenyl)-oxadiazole.

The block component (A), i.e. poly-N-vinylcarbazole, is represented by the above-mentioned formula (1). In the formula (1), the value of n, i.e. the average degree of polymerization of N-vinylcarbazole in the block component (A), is preferably between 10 to 1,000. If the value of n is less than 10, the resulting block copolymer tends to exhibit insufficient heat resistance and insufficient stability. On the other hand, a value of n exceeding 1,000 is undesirable since the resulting block copolymer solution is likely to exhibit exceedingly high viscosity and at the same time a low degree of blocking alteration.

The block component (B), i.e. poly-2-β-naphthyl-5-(4-vinylphenyl)-oxadiazole, is represented by the above-mentioned formula (2). In the formula (2), the value of m, i.e. the average degree of polymerization of 2-β-naphthyl-5-(4-vinylphenyl)-oxadiazole in the block component (B), is preferably between 10 to 1,000. If the value of m is less than 10, the resulting block copolymer tends to exhibit insufficient heat resistance, stability, and mechanical strength. On the other hand, a value of m exceeding 1,000 is undesirable since the resulting block copolymer solution is likely to exhibit an exceedingly high viscosity, reducing handling characteristics during the fabrication of organic EL cells and producing stringy solutions.

In the present invention, the block component (B) may be a copolymer of 2-β-naphthyl-5-(4-vinylphenyl)-oxadiazole and N-vinylcarbazole.

In a block copolymer of the present invention, the molar ratio of the structural unit originating from N-vinylcarbazole constituting the block component (A) to the structural unit originating from 2-β-naphthyl-5-(4-vinylphenyl)-oxadiazole constituting the block component (B) is between 0.1 to 99.9 and 99.9 to 0.1, and preferably between 1 to 99 and 99 to 1.

In case the content of the structural unit originating from N-vinylcarbazole is too low, the resulting block copolymer will exhibit an insufficient electron trapping performance, while low content of the structural unit originating from 2-β-naphthyl-5-(4-vinylphenyl)-oxadiazole will make the hole trapping performance inadequate. It is not desirable to prepare a light-emitting layer with such an unbalanced block copolymer since it provides for fewer interfaces between the poly-N-vinylcarbazole portion and the poly-2-β-naphthyl-5-(4-vinylphenyl)-oxadiazole portion, and possibly a reduced number of light-emitting sites as well.

The average molecular weight of the block copolymer of the present invention, in terms of polystyrene-reduced molecular weight, is from 5,000 to 1,000,000, and preferably from 10,000 to 500,000.

A block copolymer such as described above possesses excellent durability. Moreover, since it comprises a block component (A) having a positive hole transfer capability and a block component (B) having an electron transfer capability, an organic EL cell obtained from such a block copolymer has a high luminous efficiency.

Method for the Preparation of Block Copolymers

Next, a method for preparing the block copolymers of the present invention is described.

The block copolymer of the present invention is prepared by either a living cationic polymerization method or a living radical polymerization method.

(1) Living cationic polymerization method

In this method, for example, a cationic living polymer of N-vinylcarbazole is prepared by a cationic polymerization in an appropriate polymerization medium in the presence of a cationic polymerization catalyst. The resultant living polymer is then copolymerized by adding 2-β-naphthyl-5-(4-vinylphenyl)-oxadiazole to yield a block copolymer.

As the polymerization medium in the above process, a halogenated hydrocarbon such as methylene chloride, chlorobenzene, and the like, an ether-type solvent such as dibutyl ether, diphenyl ether, dioxane, tetrahydrofuran, and the like, or a highly polar solvent such as acetonitrile, nitrobenzene, and the like may be used.

As the cationic polymerization catalyst, HI-ZnI$_2$, I$_2$, I$_2$-HI and the like, as well as a catalyst comprising a combination of Lewis acid such as a metal halide-ether complex and a base may be used. The amount of the above-mentioned cationic polymerization catalyst added is 0.01 to 0.00001 mol for 1 mol of N-vinylcarbazole to be polymerized.

(2) Living radical polymerization method

In this method, for example, a radical living polymer of 2-β-naphthyl-5-(4-vinylphenyl)-oxadiazole is prepared by a radical polymerization in an appropriate polymerization medium in the presence of a radical polymerization catalyst. The resultant living polymer is then copolymerized by adding N-vinylcarbazole to yield a block copolymer.

As the polymerization medium in the above process, an amide type solvent such as dimethylformamide, dimethylacetoamide, N-methylpyrrolidone and the like, a hydrocarbon type solvent such as benzene, toluene, xylene, hexane, cyclohexane, and the like, an ester type solvent such as γ-butyrolactone, ethyl lactate, and the like, or a ketone type solvent such as cyclohexylbenzophenone, cyclohexanone and the like may be used.

As the radical polymerization catalyst, a system based on a peroxide and an N-oxy radical such as 4-methylsulfonyloxy-2,2', 6,6'-tetramethyl-1-piperidine-N-oxide, 2,2'-5,5'-tetramethylpyrrolidine oxide, 4-oxo-2,2',6,6'-tetramethyl-1-piperidine-N-oxide and the like, or a sulfide system catalyst may be used. The dosage of the above-mentioned radical polymerization catalyst is 0.01 to 0.00001 mol for 1 mol of the monomer. The reaction temperature is governed by the energy required to cleave the end-protected living group, and 60 to 200° C., for example.

Organic EL Cells

An organic EL cell with the following configuration can be prepared using the block copolymer of the present invention.

FIG. 1 is an illustrative sectional view describing an example of an organic EL cell utilizing the block copolymer of the present invention. In this particular organic EL cell, on a glass substrate 1 an ITO film 2 is provided as anode (i.e. the positive hole injection electrode); on the ITO film 2 a light-emitting layer 3 comprising the block copolymer of the present invention is provided; and on the light-emitting layer 3 an aluminum film 4 is provided as cathode (i.e. the electron injection electrode).

In such an organic EL cell, when a direct current is applied between the ITO film 2 and the aluminum film 4 with a DC power system 5, the light-emitting layer 3 emits light that is radiated through the ITO film 2 and the glass substrate 1.

According to the organic EL cell with the above-mentioned configuration, which is furnished with a light-emitting layer comprising the block copolymer of the present invention, high luminous efficiency is obtained since the light-emitting layer 3 itself has a positive hole transfer capability as well as an electron transfer capability. Moreover, since there is no need for separately providing a positive hole transfer layer and an electron transfer layer, the productivity can be improved in manufacturing organic EL cells.

Other features of the invention will become apparent in the course of the following description of the exemplary embodiments which are given for illustration of the invention and are not intended to be limiting thereof.

EXAMPLES

In the following descriptions, the expression of "parts" refers to "parts by weight", unless otherwise specified:

Example 1

A 500-ml pressure bottle was charged with a methylene chloride solution wherein 15.5 parts of N-vinylcarbazole had been dissolved under a flow of nitrogen gas and then the solution was cooled to −78° C. While stirring the above solution, HI-ZnI$_2$ was added as a cationic polymerization catalyst at the rate 1/500 mol for 1 mol of N-vinylcarbazole to perform a cationic polymerization of N-vinylcarbazole.

After confirming that the reaction rate of N-vinylcarbazole had reached 98% or higher by means of a TSC method, 1.5 parts of 2-β-naphthyl-5-(4-vinylphenyl)-oxadiazole were added into the above reaction system under a flow of nitrogen gas, and block copolymerization of the oxadiazole via living cationic polymerization was carried out for 8 hours.

The resultant polymer solution was gradually warmed to room temperature, and methanol in the quantity of five times the weight of the polymer solution was added to coagulate and recover the block copolymer. The block copolymer was then purified by reprecipitation with a conventional method, and vacuum dried for one day at 50° C.

An analysis of the above-mentioned block copolymer has shown that the molar ratio of the structural unit originating from N-vinylcarbazole to the structural unit originating from 2-β-naphthyl-5-(4-vinylphenyl)-oxadiazole was 95 to 5. Further, the average degree of polymerization of the block component (A) comprising poly-N-vinylcarbazole was 500, and that of block component (B) comprising poly-2-β-naphthyl-5-(4-vinylphenyl)-oxadiazole was 10. The polystyrene-reduced average molecular weight of the block copolymer was 63,800.

Examples 2–5

Block copolymers were prepared in the same manner as in the Example 1 except N-vinylcarbazole and 2-β-naphthyl-5-(4-vinylphenyl)-oxadiazole were used in accordance with the recipe given in Table 1 below. The molar ratios of the structural units originating from N-vinylcarbazole to the structural units originating from 2-β-naphthyl-5-(4-vinylphenyl)-oxadiazole, the average degrees of polymerization of the block component (A) comprising poly-N-vinylcarbazole and those of block component (B) comprising poly-2-β-naphthyl-5-(4-vinylphenyl)-oxadiazole, and the polystyrene-reduced average molecular weights of the resultant block copolymers are given in Table 1:

TABLE 1

|  | Example 1 | Example 2 | Example 3 | Example 4 | Example 5 |
| --- | --- | --- | --- | --- | --- |
| Monomer (part) |  |  |  |  |  |
| N-vinylcarbazole | 15.5 | 14.3 | 16.3 | 4.9 | 1.6 |
| 2-β-naphthyl-5-(4-vinylphenyl)-oxadiazole | 1.5 | 3.0 | 30.0 | 21.0 | 13.5 |
| Block copolymer |  |  |  |  |  |
| Molar ratio of structural units (A) and (B)  (A) | 95 | 90 | 50 | 30 | 10 |
| (B) | 5 | 10 | 50 | 70 | 90 |
| Average degrees of polymerization of the block component (A) | 500 | 890 | 500 | 310 | 105 |
| Average degrees of polymerization of the block component (B) | 10 | 100 | 495 | 705 | 900 |
| Polystyrene-reduced average molecular weight | 63,800 | 103,000 | 110,000 | 106,000 | 98,000 |

In Table 1 above, "Structural unit (A)" refers to the "structural units originating from N-vinylcarbazole", and "Structural unit (B)", to the "structural units originating from 2-β-naphthyl-5-(4-vinylphenyl)-oxadiazole".

Example 6

Contents of a 300-ml glass-made pressure container were thoroughly replaced by nitrogen, and then 10.5 parts of 2-β-naphthyl-5-(4-vinylphenyl)-oxadiazole and 30 parts of dehydrated and nitrogen-sealed dimethylformamide were fed into the glass container. After adding 1.5 parts of TEMPO-BPO as a radical polymerization catalyst into the above solution, 2-β-naphthyl-5-(4-vinylphenyl)-oxadiazole was polymerized for 3 hours at 90° C. The reaction solution presented a wine-red color. Subsequently, the reaction system was warmed to 135° C. and the polymerization of 2-β-naphthyl-5-(4-vinylphenyl)-oxadiazole was carried on for 60 more hours. After that, 2.5 parts of N-vinylcarbazole were added into the above reaction system under a flow of nitrogen gas, and block copolymerization of N-vinylcarbazole via living radical polymerization was performed for 60 hours.

The resultant polymer solution was cooled down to a room temperature, and methanol in the quantity of ten times the weight of the polymer solution was added to coagulate and recover the block copolymer. The block copolymer was then purified by reprecipitation with a conventional method, and vacuum dried for one day at 50° C.

Analysis of the above-mentioned block copolymer has shown that the molar ratio of the structural unit originating from N-vinylcarbazole to the structural unit originating from 2-β-naphthyl-5-(4-vinylphenyl)-oxadiazole was 3 to 7. Further, the average degree of polymerization of the block component (A) comprising poly-N-vinylcarbazole was 30, and that of block component (B) comprising poly-2-β-naphthyl-5-(4-vinylphenyl)-oxadiazole was 70. The polystyrene-reduced average molecular weight of the block copolymer was 27,000.

Evaluation of Block Copolymers

Using the block copolymers obtained in Examples 1 through 6, organic EL cells configured as illustrated in FIG. 1 were prepared as follows:

Each block copolymer was dissolved in a 2:8 mixture (by weight) of chlorobenzene and chloroform. The solution was then spin-coated on a 5 by 5-cm glass substrate that had an ITO film formed on it, and the solvent was removed to leave a light-emitting layer having a thickness of 500 Å. Subsequently, on top of the above light-emitting layer, a 5-mm square aluminum film having a thickness of 1,000 Å was formed by a vapor deposition process.

As Comparative Examples 1 and 2, organic EL cells were prepared in the same manner as above using poly-N-vinylcarbazole (average molecular weight: 30,000) and poly-2-β-naphthyl-5-(4-vinylphenyl)-oxadiazole (average molecular weight: 28,000), respectively.

Electroluminescence of the light-emitting layer of organic EL cells prepared as described above was determined by applying a direct current between the ITO film as anode and the aluminum film as cathode. The applied voltages and the luminance are summarized in Table 2.

TABLE 2

|  | Voltage (V) | Luminance (cd/m²) |
| --- | --- | --- |
| Example 1 | 10 | 180 |
| Example 2 | 10 | 185 |
| Example 3 | 10 | 200 |
| Example 4 | 10 | 280 |
| Example 5 | 10 | 190 |
| Example 6 | 10 | 230 |
| Comparative Example 1 | 25 | 30 |
| Comparative Example 2 | 30 | 45 |

It is evident from Table 2 that the organic EL cells built on the light-emitting layers comprising the block copolymers of Examples 1 through 6 have higher luminous efficiency than that of organic EL cells based on the light-emitting layers comprising poly-N-vinylcarbazole or poly-2-β-naphthyl-5-(4-vinylphenyl)-oxadiazole.

Example 7

In a 50-ml pressure bottle which was nitrogen sealed, 2.8 g of N-vinylcarbazole, 0.6 g of 2-β-naphthyl-5-(4-vinylphenyl)-oxadiazole, and 35 mg of 1,1'-azobis(1-acetoxy-1-phenylethane) were dissolved in 10 ml of dimethylformamide, and polymerized at 60° C. After 10 hours of polymerization reaction, the resultant polymer was coagulated with methanol and recovered, then purified by reprecipitation with a conventional method to yield 3.2 g of the object polymer. The polymer thus obtained had a molecular weight of 21,000 and an Mw/Mn ratio of 1.4.

The resultant polymer was analyzed and determined to have comprised a block component based on polyvinylcarbazole and a copolymer component consisting of vinylcarbazole and oxadiazole, the over-all composition of which was virtually identical to the feed composition.

An organic EL cell prepared by dissolving the above polymer in 1,2-dichloroethane and otherwise in the same manner as in Example 1 showed a luminance of 300 cd/m² at 18 V.

The block copolymer of the present invention provides organic EL cells having high luminous efficiency as well as excellent durability since the block component (A) comprising poly-N-vinylcarbazole has a positive hole transfer capability and the block component (B) comprising poly-2-β-naphthyl-5-(4-vinylphenyl)-oxadiazole has an electron transfer capability. Moreover, since there is no need for separately providing a positive hole transfer layer and an electron transfer layer, the productivity can be improved in manufacturing organic EL cells.

Obviously, numerous modifications and variations of the present invention are possible in light of the above teachings. It is therefore to be understood that, within the scope of the appended claims, the invention may be practiced otherwise than as specifically described herein.

What is claimed is:

1. An electroluminescence cell comprising a layer of a block copolymer comprising a block component (A) of the following formula (1),

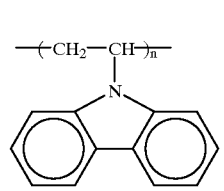

wherein n is an integer from 10 to 1,000, and a block component (B) of the following formula (2),

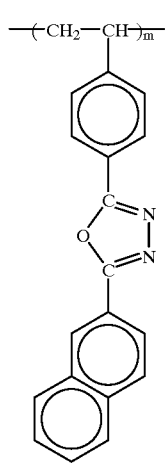

(2)

wherein m is an integer from 10 to 1,000,
wherein a molar ratio of the block component (A) to the block (B) is between 0.1:99.9 and 99.9:0.1.

2. The electroluminescence cell according to claim 1, wherein the molar ratio of the block component (A) to the block component (B) is between 0.1:99.9 and 99.9:0.1.

3. The electroluminescence cell according to claim 1, wherein the layer of the block copolymer comprising the block component (A) and the block component (B) is a light-emitting layer.

4. An electroluminescence cell comprising a hole injection electrode layer, an electron injection light-emitting hole layer, and a light-emitting layer which is comprised of a block copolymer comprising a block component (A) of the following formula (1),

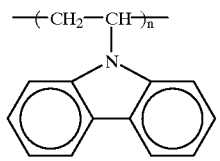

(1)

wherein n is an integer from 10 to 1,000, and a block component (B) of the following formula (2),

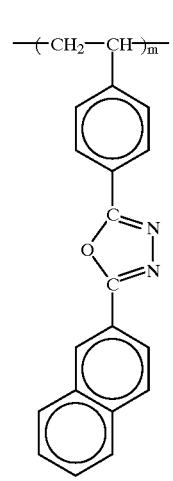

(2)

wherein m is an integer from 10 to 1,000,
wherein a molar ratio of the block component (A) to the block component (B) is between 0.1:99.9 and 99.9:0.1.

5. The electroluminescent cell according to claim 1, further comprising a hole injection electrode, wherein the layer of the block copolymer is provided on the hole injection electrode.

6. The electroluminescent cell according to claim 1, further comprising an electron injection electrode provided on the layer of the block copolymer.

7. A method of producing an electroluminescence cell, the method comprising forming the layer of a block copolymer of claim 1.

8. A method of producing an electroluminescence cell, the method comprising forming the light-emitting layer which is comprised of a block copolymer of claim 4.

9. A method of producing light, the method comprising applying a direct current to the electroluminescence cell of claim 1.

10. A method of producing light, the method comprising applying a direct current to the electroluminescence cell of claim 4.

* * * * *